(12) United States Patent
Shin

(10) Patent No.: US 7,413,956 B2
(45) Date of Patent: Aug. 19, 2008

(54) SEMICONDUCTOR DEVICE MANUFACTURING METHOD

(75) Inventor: Yong Wook Shin, Gwangju-Si (KR)

(73) Assignee: Magnachip Semiconductor, Ltd., Cheongju-si (KR)

(*) Notice: Subject to any disclaimer, the term of this patent is extended or adjusted under 35 U.S.C. 154(b) by 191 days.

(21) Appl. No.: 11/181,577

(22) Filed: Jul. 13, 2005

(65) Prior Publication Data

US 2007/0026592 A1    Feb. 1, 2007

(51) Int. Cl.
*H01L 21/336* (2006.01)
(52) U.S. Cl. .................. 438/299; 438/303; 438/682
(58) Field of Classification Search ................ 438/197, 438/592, 301, 299, 303, 655, 682, 683
See application file for complete search history.

(56) References Cited

U.S. PATENT DOCUMENTS 6,084,280 A    7/2000    Gardner et al.
6,335,550 B1 *  1/2002   Miyoshi et al. ............. 257/295
6,503,833 B1    1/2003   Ajmera et al.

* cited by examiner

*Primary Examiner*—Kevin M Picardat
(74) *Attorney, Agent, or Firm*—Marshall, Gerstein & Borun LLP

(57) ABSTRACT

Disclosed are a semiconductor device and a method for manufacturing the same. The semiconductor device includes a semiconductor substrate, in which active and inactive regions are separated by a field oxidation film; source/drain junctions contacting the field oxidation film and formed in the active regions of the semiconductor substrates; a buffer oxidation film formed at designated portions of the source/drain junctions, and a gate electrode formed on the semiconductor substrate adjacent to the buffer oxidation film; and a silicide film formed at designated portions of the source/drain junctions and the upper surface of the gate electrode.

7 Claims, 3 Drawing Sheets

SEMICONDUCTOR DEVICE MANUFACTURING METHOD

BACKGROUND OF THE INVENTION

1. Field of the Invention

The present invention relates to a method for manufacturing a semiconductor device, and more particularly to a method for manufacturing a semiconductor device using a salicide process in which silicide is formed simultaneously on a gate and source/drain regions.

2. Description of the Related Art

In a conventional method for manufacturing a semiconductor device having a size of less than 1.2 μm, silicide is formed on a polysilicon substrate using tungsten, and is used as a gate electrode of a metal oxide semiconductor field effect transistor (MOSFET). However, as semiconductor devices become increasingly high-integrated to have a size less then 0.35 μm, various methods for forming electrodes using titanium in MOS transistors are widely used.

FIGS. 1A to 1D are sectional views illustrating a conventional method for manufacturing a semiconductor device.

As shown in FIG. 1A, a field oxidation film 110 for insulating unit complementary metal oxide semiconductor field effect transistors (CMOSFETs) from each other is formed on a silicon substrate 100.

Thereafter, as shown in FIG. 1B, a gate oxidation film 140 for forming a gate is grown on the silicon substrate 100. Then, a polysilicon gate is formed by stacking a polysilicon film 150 doped with impurities serving as an electrode of the gate on the gate oxidation film 140 and forming a pattern using a mask.

As shown in FIG. 1C, source/drain junctions 170 are formed by injecting impurities two to four times into regions used as source and drains of a transistor using a spacer oxidation films 160 interposed between.

Thereafter, a blank oxidation film 180 is formed on the field oxidation film 110, and is removed from places other than regions, in which silicide is not formed, by etching.

Then, a silicide film 190 is formed by a salicide process.

In the conventional method for forming silicide using the conventional technique, since a process margin does not exist when the etching of the spacer oxidation film or the blank oxidation film is performed during the formation of the source and drains, the silicide film is formed or remains through the side wall of the transistor even by a small error in the process, thereby generating short between a gate and the drains or between the gate and the source, or increasing parasitic capacitor, thus exerting a negative influence upon yield and characteristics of products.

Accordingly, a method for manufacturing a semiconductor device, in which a process margin for etching is assured to solve various problems generated from the formation of silicide, has been increasingly required.

SUMMARY OF THE INVENTION

Therefore, the present invention has been made in view of the above problems, and it is an object of the present invention to provide a semiconductor device, in which the height of the side wall of a polysilicon gate is increased to solve problems generated from the formation of silicide along the side wall of a transistor, and a method for manufacturing the same.

In accordance with one aspect of the present invention, the above and other objects can be accomplished by the provision of a semiconductor device comprising: a semiconductor substrate, in which active regions and inactive regions are separated from each other by a field oxidation film; source/drain junctions contacting the field oxidation film and formed in the active regions of the semiconductor substrates; a buffer oxidation film formed at designated portions of the source/drain junctions, and a gate electrode formed on the semiconductor substrate adjacent to the buffer oxidation film; and a silicide film formed at designated portions of the source/drain junctions and the upper surface of the gate electrode.

Preferably, a blank oxidation film may be formed at regions at which the silicide film is not formed. The blank oxidation film protects portions of the silicon substrate, at which the silicide film is not formed.

Further, preferably, the buffer oxidation film may be formed on designated portions of the source/drain junctions opposite to the field oxidation film. The buffer oxidation film, which is present under the gate electrode, increases the height of the side wall of the gate electrode, thereby assuring a process margin in etching a spacer oxidation film or the blank oxidation film.

Preferably, the designated portions of the source/drain junctions on which the silicide film is formed may be regions in which the blank oxidation film and the buffer oxidation film are not formed.

The silicide film may be made of any kind of silicide. Preferably, the silicide film is made of Ti silicide.

In accordance with another aspect of the present invention, there is provided a method for manufacturing a semiconductor device comprising: forming a field oxidation film on inactive regions of a silicon substrate; forming buffer oxidation film impurity junctions on source and drain regions of the silicon substrate provided with the field oxidation film, and forming a buffer oxidation film thereon; forming a gate electrode on the above structure, and forming a spacer oxidation film on the side wall of the gate electrode; forming source/drain junctions on the silicon substrate under both sides of the gate electrode; and forming a blank oxidation film on regions of the structure other than regions in which a silicide film is formed, and forming the silicide film by performing a salicide process.

Preferably, the buffer oxidation film may be selectively formed only in the source and drain regions using a nitride film. Further, preferably, the buffer oxidation film may be used, when impurities are injected to form the source/drain junctions, without using an additional oxidation film for protecting the silicon substrate. Thereby, it is possible to simplify the process of manufacturing the semiconductor device, and to shorten the overall time of the process.

Preferably, designated portions of the buffer oxidation film may be removed when the blank oxidation film is etched after impurities are injected into the silicon substrate to form the source/drain junctions. More preferably, the removed portions of the buffer oxidation film may be not included by the gate electrode. Thereby, the buffer oxidation film remains only at the ends of the lower portion of the gate.

The silicide film may be made of any kind of silicide formed by the salicide process. Preferably, the silicide film is made of Ti silicide. Here, the silicide film is formed by bonding titanium and silicon. The titanium located on the oxidation film is not reacted with the silicon and is selectively removed in the etching step.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, a preferred embodiment of the present invention will be described in detail with reference to the annexed drawings.

The embodiment does not limit the scope and spirit of the invention, but has been disclosed for illustrative purposes.

Preferred Embodiment

FIGS. 2A to 2E are sectional views illustrating a method for manufacturing a semiconductor device in accordance with a preferred embodiment of the present invention.

Figure 1A:
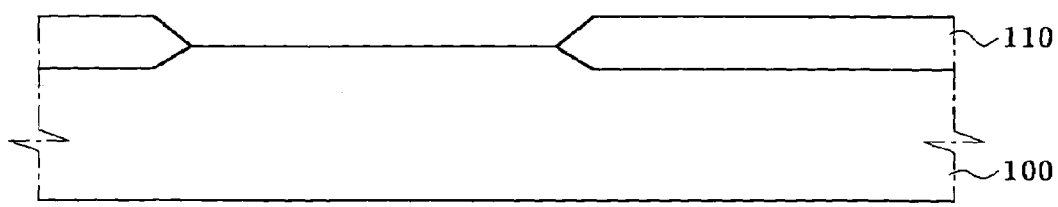
FIGS. 1A to 1D are sectional views illustrating a conventional method for manufacturing a semiconductor device.
Figure 1B:
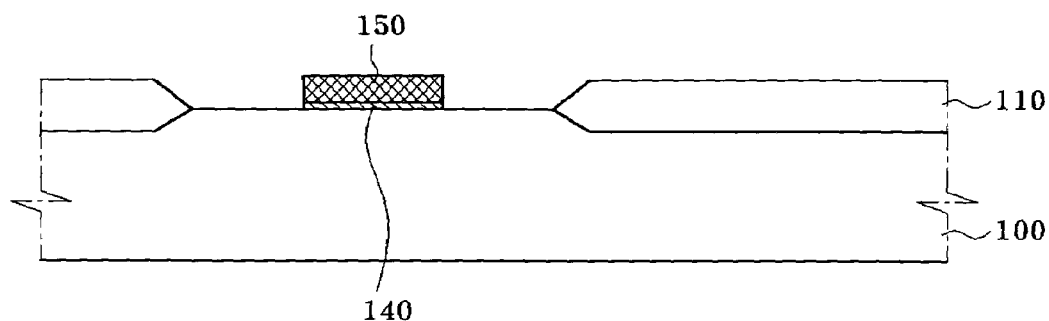
Figure 1C:
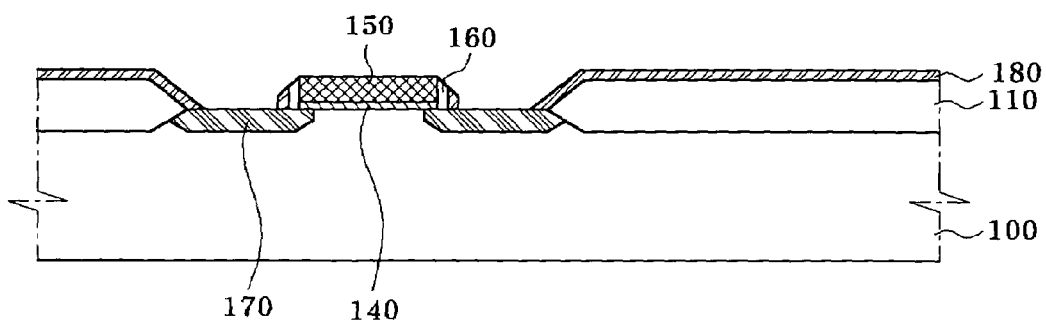
Figure 1D:
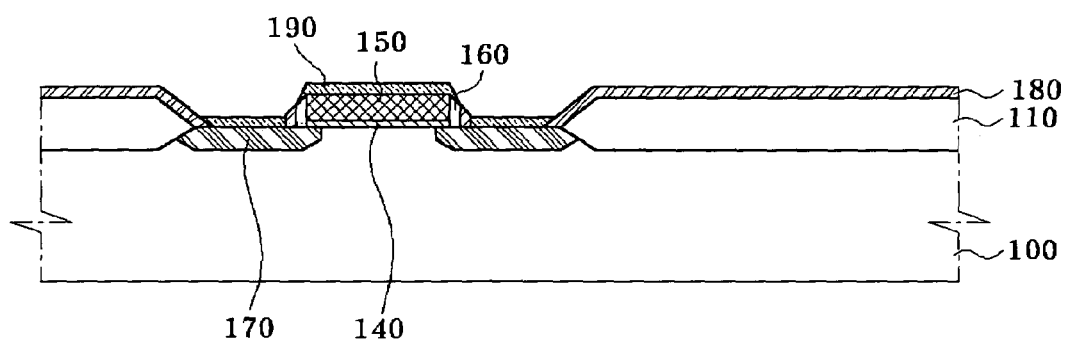
Figure 2A:
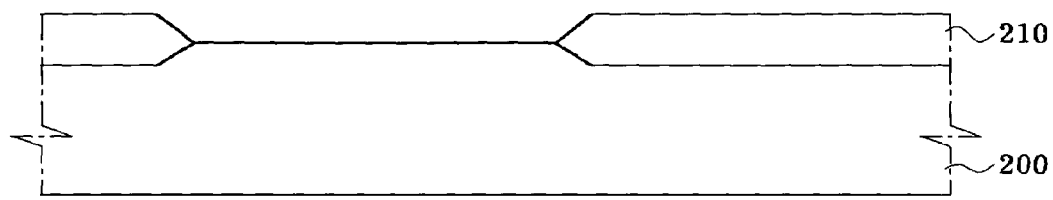
FIGS. 2A to 2E are sectional views illustrating a method for manufacturing a semiconductor device in accordance with a preferred embodiment of the present invention.

First, as shown in FIG. 2A, a field oxidation film 210 for insulating unit transistors from each other is formed on a silicon substrate 200.

Figure 2B:
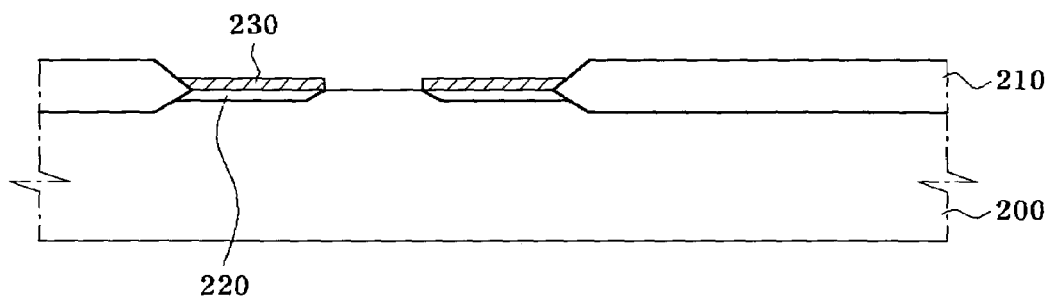

Thereafter, as shown in FIG. 2B, a nitride film (not shown) for forming a buffer oxidation film 230 is stacked on the silicon substrate 200. Buffer oxidation film impurity junctions 220 are formed by forming a pattern using an oxidation film mask and injecting impurities for reducing a hot carrier effect and activating a channel. Then, a thermal process for forming a field oxidation film is performed, thereby forming an active region of a transistor, in which a gate electrode is not formed, and forming the buffer oxidation film 230 at end portions of the field oxidation films 210.

Subsequent steps are the same as those of the conventional process for manufacturing a salicide logic CMOS transistor.

Figure 2C:
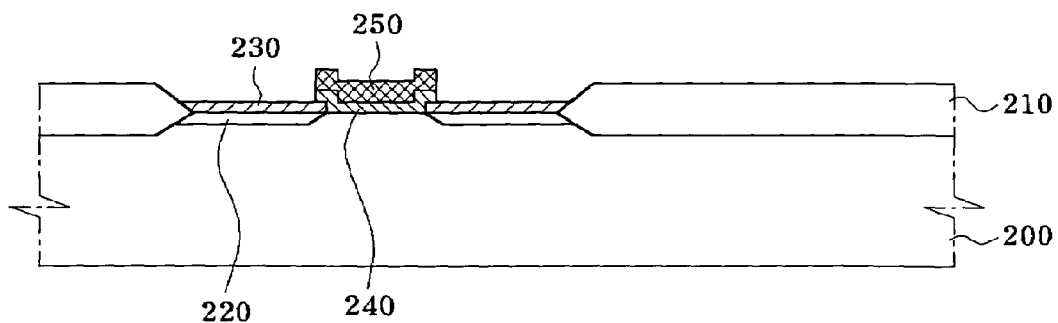

That is, as shown in FIG. 2C, a gate oxidation film 240 of the transistor is formed, and a polysilicon film 250 is stacked on the gate oxidation film 240. Then, the polysilicon film 250 is patterned using a mask, thereby producing a gate electrode. Here, since the buffer oxidation film 230 is present under the side wall of the polysilicon gate, the side wall of the polysilicon gate has a large height. Further, a process margin for the etching of a spacer oxidation film and a blank oxidation film is obtained. Accordingly, it is possible to prevent the formation of silicide along the side wall of the gate, thereby preventing the generation of short between the gate and the source or between the gate and the drains and the generation of parasitic capacitance, thus assuring the safety of the semiconductor device.

Thereafter, a gate spacer oxidation film 260 is formed on the side wall of the gate electrode.

Figure 2D:
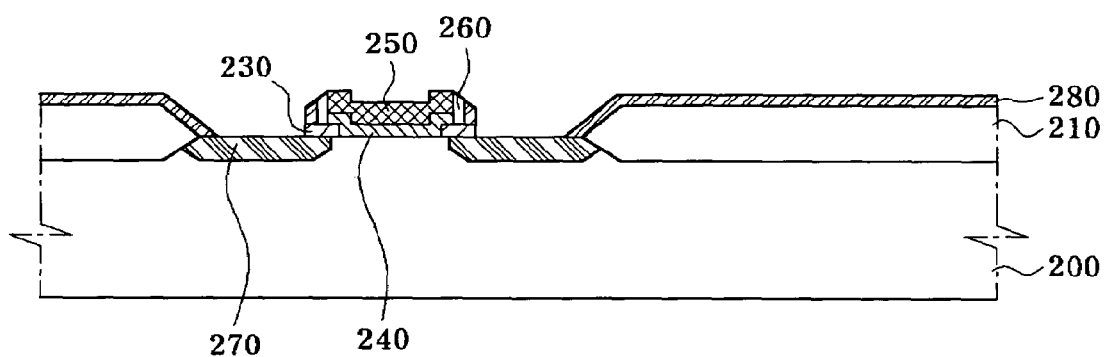

Then, as shown in FIG. 2D, source/drain junctions 270 are formed by injecting impurities into regions in which a source and drains of a transistor will be formed. When the impurity injection for forming the source and drains is performed, the buffer oxidation film 230 remaining in source and drain regions prevents the damage to the silicon substrate 200. Accordingly, a separate oxidation film for protecting the silicon substrate 200 is not required.

Thereafter, in order to protect the spacer oxidation film 260 formed on the side wall of the polysilicon gate and a specific circuit not requiring silicide, a blank oxidation film 280 is stacked on the silicon substrate 200, and a necessary portion of the blank oxidation film 280 is removed by patterning using a mask and etching. Here, the buffer oxidation film 230 remaining in the source and drain regions is removed together with the removal of the blank oxidation film 280.

Figure 2E:
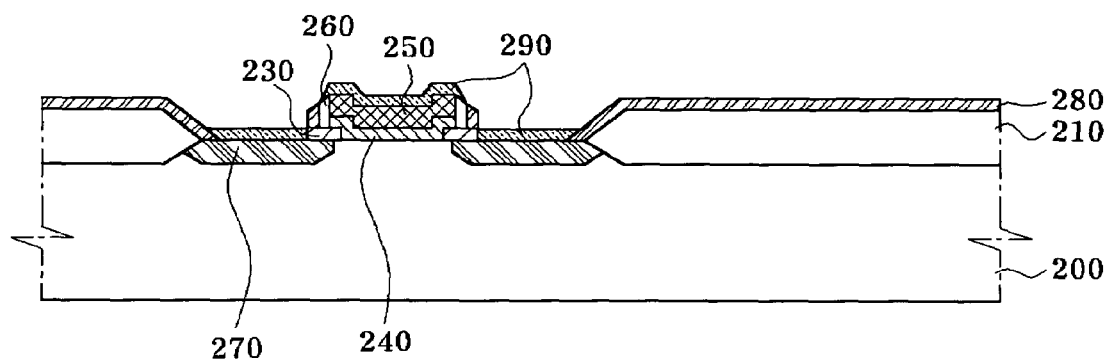

As shown in FIG. 2E, silicide is formed by stacking titanium (not shown) on the silicon substrate 200 and performing a thermal process. Here, a titanium silicide film 290 is formed in regions, in which silicon and titanium are bonded, and titanium, which is not bonded to the silicon and located on the oxidation film, is selectively etched at a subsequent step.

Thereafter, an insulating film for a metal serving as an electrode and a metal process are the same as those of a general CMOS logic process.

As apparent from the above description, the present invention provides a semiconductor device, in which the height of the side wall of a polysilicon gate is increased by a buffer oxidation film so that a process margin, when a spacer oxidation film or a blank oxidation film is etched, is assured, and a method for manufacturing the same. Thereby, it is possible to prevent problems, such as shorts between a gate and drains or between the gate and a source generated due to the formation or remaining of silicide along the side wall of a transistor, and to greatly reduce parasitic capacitor, thus improving yield and characteristics of the semiconductor device.

Further, impurities, for reducing a hot carrier effect and activating a channel when buffer oxidation film impurity junctions are formed, are injected into a silicon substrate, thereby decreasing an electric field effect generated from the drain regions, thus increasing the deterioration of the semiconductor device due to the hot carrier effect.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device comprising:

forming a field oxidation film on inactive regions of a silicon substrate;

forming buffer oxidation films on active regions of the semiconductor substrate, wherein the buffer oxidation films expose the semiconductor substrate where a gate electrode is to be formed;

forming an insulating film on the exposed semiconductor substrate and the buffer oxidation films;

depositing a gate conductive film on the insulating film;

patterning the gate conductive film and the insulating film to form a gate electrode and a gate insulating film, wherein both ends of the gate insulating film and the gate electrode overlap the end of the buffer oxidation films;

forming a spacer insulating film for preventing a silicide film from being formed at the sidewalls of the gate electrode;

forming source/drain junctions on the silicon substrate adjacent to, but not directly under, the gate electrode; and forming a silicide film at designated portions of the source/drain junctions and on the upper surface of the gate electrode.

2. The method as set forth in claim 1, wherein the buffer oxidation film is selectively formed only in the source/drain junctions using a nitride film as a mask.

3. The method as set forth in claim 1, wherein the buffer oxidation film is used, when impurities are injected into the silicon substrate to form the source/drain junctions, without using an additional oxidation film for protecting the silicon substrate.

4. The method as set forth in claim 1, wherein designated portions of the buffer oxidation film are removed when the blank oxidation film is etched after impurities are injected into the silicon substrate to form the source/drain junctions.

5. The method as set forth in claim 1, comprising forming a blank oxidation film on regions of the structure other than regions in which the silicide film is formed prior to the step of forming the silicide film.

6. The method as set forth in claim 1, wherein the silicide film is made of Ti silicide.

7. The method as set forth in claim 2, comprising implanting impurities into the source/drain junctions of the semiconductor substrate to form buffer oxidation film impurity junctions prior to forming the buffer oxidation film using the nitride film as a mask.

\* \* \* \* \*